US007162707B2

(12) United States Patent
Kanaoka et al.

(10) Patent No.: US 7,162,707 B2
(45) Date of Patent: Jan. 9, 2007

(54) SCAN PATH TIMING OPTIMIZING APPARATUS DETERMINING CONNECTION ORDER OF SCAN PATH CIRCUITS TO REALIZE OPTIMUM SIGNAL TIMINGS

(75) Inventors: Toshihiro Kanaoka, Hyogo (JP); Genichi Tanaka, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 231 days.

(21) Appl. No.: 10/445,832

(22) Filed: May 28, 2003

(65) Prior Publication Data

US 2004/0111689 A1 Jun. 10, 2004

(30) Foreign Application Priority Data

Dec. 4, 2002 (JP) .............................. 2002-352817

(51) Int. Cl.
*G06F 17/50* (2006.01)
*G01R 31/28* (2006.01)
(52) U.S. Cl. .................... 716/13; 716/2; 716/3; 716/4; 716/6; 716/10; 714/726; 714/729
(58) Field of Classification Search ................ 716/2–4, 716/6, 10, 13, 18; 714/726, 729
See application file for complete search history.

(56) References Cited

U.S. PATENT DOCUMENTS 5,212,651 A * 5/1993 Yabe .............................. 716/4
5,949,692 A * 9/1999 Beausang et al. ............. 716/18
5,963,730 A * 10/1999 Toyonaga et al. ............. 716/3
5,999,716 A * 12/1999 Toyonaga ..................... 716/10
6,106,568 A * 8/2000 Beausang et al. ............. 716/18
6,256,770 B1 * 7/2001 Pierce et al. .................. 716/18
6,681,356 B1 * 1/2004 Gerowitz et al. ........... 714/729
2004/0015803 A1 * 1/2004 Huang et al. ................. 716/10

FOREIGN PATENT DOCUMENTS

| JP | 10207921 A | * | 8/1998 |
| JP | 10-335471 A | | 12/1998 |
| JP | 11272729 A | * | 10/1999 |
| JP | 2004078759 A | * | 3/2004 |

OTHER PUBLICATIONS

Narayanan et al., "SIESTA: a multi-facet scan design system", Sep. 7-10, 1992, Design Automation Conference, 1992. EURO-VHDL '92, EURO-DAC '92, European, pp. 246-251 □□.*
Kobayashi et al., "Scan-chain optimization algorithms for multiple scan-paths", Feb. 10-13, 1998, Design Automation Conference 1998. Proceedings of the ASP-DAC '98. Asia and South Pacific,□□pp. 301-306□□.*

* cited by examiner

*Primary Examiner*—Jack Chiang
*Assistant Examiner*—Helen Rossoshek
(74) *Attorney, Agent, or Firm*—Buchanan Ingersoll & Rooney PC

(57) ABSTRACT

An intra-area connection order determining unit determines at random orders of connection of scan path circuits in each area divided by an placement area dividing unit. An inter-area connection order determining unit determines orders of connection of the scan path circuits between the areas such that length of interconnection between the areas divided by the placement area dividing unit becomes short. Accordingly, length of interconnection between the scan paths can be locally made short, reducing congestion of interconnections and generation of hold time errors.

10 Claims, 14 Drawing Sheets

SCAN PATH TIMING OPTIMIZING APPARATUS DETERMINING CONNECTION ORDER OF SCAN PATH CIRCUITS TO REALIZE OPTIMUM SIGNAL TIMINGS

BACKGROUND OF THE INVENTION

1. Field of the Invention

The present invention relates to scan path circuits and, more specifically, to a scan path timing optimizing apparatus determining connection order of scan path circuits to realize optimum signal timings.

2. Description of the Background Art

Recently, along with ever increasing speed of operation and higher degree of integration of semiconductor circuits, it has become more and more common to provide a built-in, scanning type test circuits. Conventional scanning type test circuits utilize, as methods of determining order of connection of scan path circuits, a method in which the order of connection of scan terminals of sequential circuits (hereinafter referred generally as FFs), including a flip-flop circuit, a latch circuit or an IP (intellectual property) constituting the scan path circuits, is determined without considering placement information of the scan path circuits, and a method in which the order of connection of scan terminals of FFs is determined considering placement information of the scan path circuits.

Japanese Patent Laying-Open No. 10-335471 discloses one technique related to the method in which the orders of connection of scan terminals of FF is determined considering placement information of the scan path circuits. In the method of interconnecting a scan path network disclosed in Japanese Patent Laying-Open No. 10-335471, placement and design of standard cells and the like are performed based on circuit information of an LSI (Large Scale Integrated circuit), for example, and clock path delay time of each FF in the LSI is estimated by a clock delay calculating process. By a skew estimating process, clock skew between each FF is calculated.

Further, distance between each FF is calculated by a distance calculating process. By a path selection process, order of connection between each FF is determined considering not only the distance but also the clock skew. Thus, possibility of hold time errors is reduced.

The above-described method in which the order of connection of scan terminals of FFs is determined without considering placement information of the scan path circuits, however, is problematic, as interconnections between cells including the scan path circuits become congested, possibly resulting in unmanageable interconnection.

In the method in which the order of connection of scan terminals of FFs is determined considering placement information of the scan path circuits, the order of connection is determined to make shortest the interconnections between scan terminals of the FFs. Therefore, data transfer time may possibly be too short, resulting in a hold time error. Here, it becomes necessary to improve timings by inserting buffers between scan terminals, so as to avoid the hold time error. When the number of hold time errors is large, however, the number of buffers would be too much increased, making cell placement or interconnection impossible.

In the method of interconnecting a scan path network disclosed in Japanese Patent Laying-Open No. 10-335471, order of connection between each FF is determined considering not only the distance but also the clock skew. This means that every distance and every clock skew between each FF must be calculated, and therefore, it is difficult to quickly determine the order of connection between each FF.

SUMMARY OF THE INVENTION

An object of the present invention is to provide a scan path timing optimizing apparatus that reduces congestion of interconnections and reduces generation of hold time errors.

According to one aspect of the present invention, a scan path timing optimizing apparatus includes an placement area dividing unit dividing a cell placement area into a plurality of areas, an intra-area connection order determining unit determining at random the order of connection of scan path circuits in each area divided by the placement area dividing unit, and an inter-area connection order determining unit determining the order of connection of scan path circuits between the areas such that interconnection length between the areas divided by the placement area dividing unit is made short.

As the intra-area connection order determining unit determines at random the order of connection of scan path circuits in each area divided by the placement area dividing unit and the inter-area connection order determining unit determines the order of connection of scan path circuits between the areas such that interconnection length between the areas divided by the placement area dividing unit is made short, the length of interconnection between scan paths can be locally made longer. Therefore, congestion of interconnections and generation of hold time errors can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

For easier understanding of the scan path timing optimizing apparatus in accordance with the first embodiment of the present invention, the method in which the order of connection of scan path circuits is determined without considering placement information and the method in which the order of connection of scan path circuits is determined considering placement information will be described.

Figure 1:
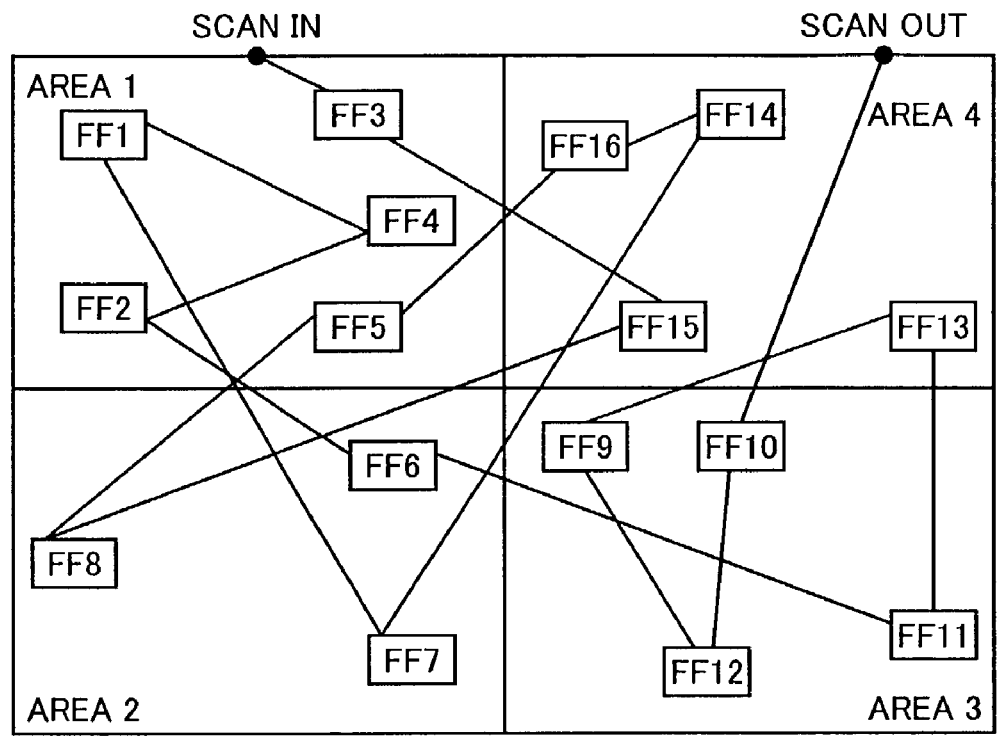
FIG. 1 is a diagram illustrating the method of determining order of connection of scan path circuits without considering placement information.

FIG. 1 is a diagram illustrating the method of determining order of connection of scan path circuits without considering placement information. In FIG. 1, the cell placement area is divided into area 1 to area 4. It is noted that as arbitrary FFs are connected independent of the areas, generally the interconnection between each FF is long. This results in congestion of interconnections, hindering interconnection of cells.

Figure 2:
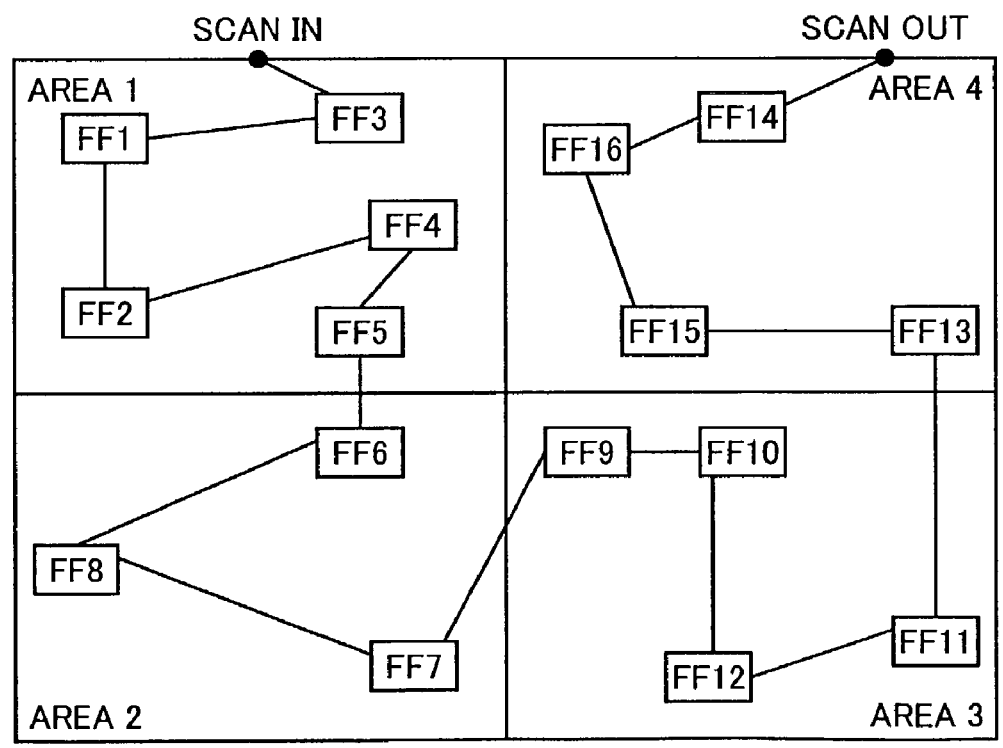
FIG. 2 is a diagram illustrating the method of determining order of connection of scan path circuits considering placement information so as to shorten length of interconnection.

FIG. 2 is a diagram illustrating the method of determining order of connection of scan path circuits considering placement information so as to shorten length of interconnection. Length of every interconnection between each FF is made short, and therefore, data transfer time between FFs may be too short, possibly causing a hold time error of the scan path circuits.

Figure 3:
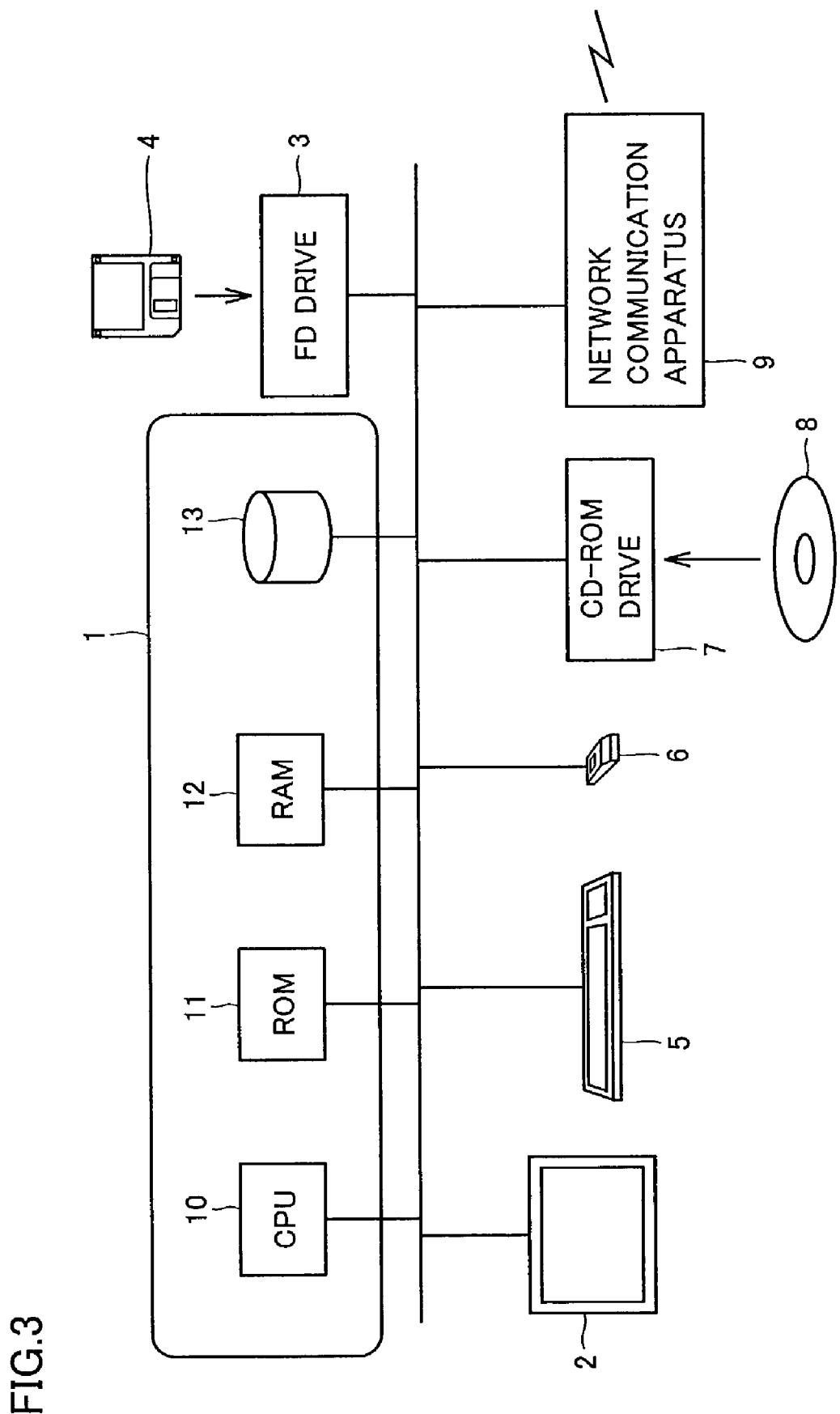
FIG. 3 is a block diagram representing an example of the scan path timing optimizing apparatus in accordance with the first embodiment of the present invention.

FIG. 3 is a block diagram representing an example of the scan path timing optimizing apparatus in accordance with the first embodiment of the present invention. The scan path timing optimizing apparatus includes a computer body 1, a display 2, an FD (Flexible Disk) drive 3 to which an FD 4 is mounted, a key board 5, a mouse 6, a CD-ROM (Compact Disk-Read Only Memory) drive 7 to which a CD-ROM 8 is mounted, and a network communication apparatus 9.

A program implementing the scan path timing optimizing apparatus (hereinafter referred to as scan path timing optimizing program) is supplied through a recording medium such as FD 4 or CD-ROM 8. As the scan path timing optimizing program is executed by computer body 1, the timings of the scan path circuits are optimized. The scan path timing optimizing program may be supplied to computer body 1 from another computer through network communication apparatus 9.

Computer body 1 includes a CPU (Central Processing Unit) 10, a ROM (Read Only Memory) 11, a RAM (Random Access Memory) 12 and a hard disk 13. CPU 10 performs processes while inputting/outputting data to and from display 2, FD drive 3, keyboard 4, mouse 5, CD-ROM drive 7, network communication apparatus 9, ROM 11, RAM 12 or hard disk 13. The scan path timing optimizing program recorded on FD 4 or CD-ROM 8 is once stored in hard disk 13 by CPU 10, through FD drive 3 or CD-ROM drive 7. CPU 10 loads the scan path optimizing program appropriately form hard disk 13 to RAM 12 and executes the program, so that timings of the scan path circuits are optimized.

Figure 4:
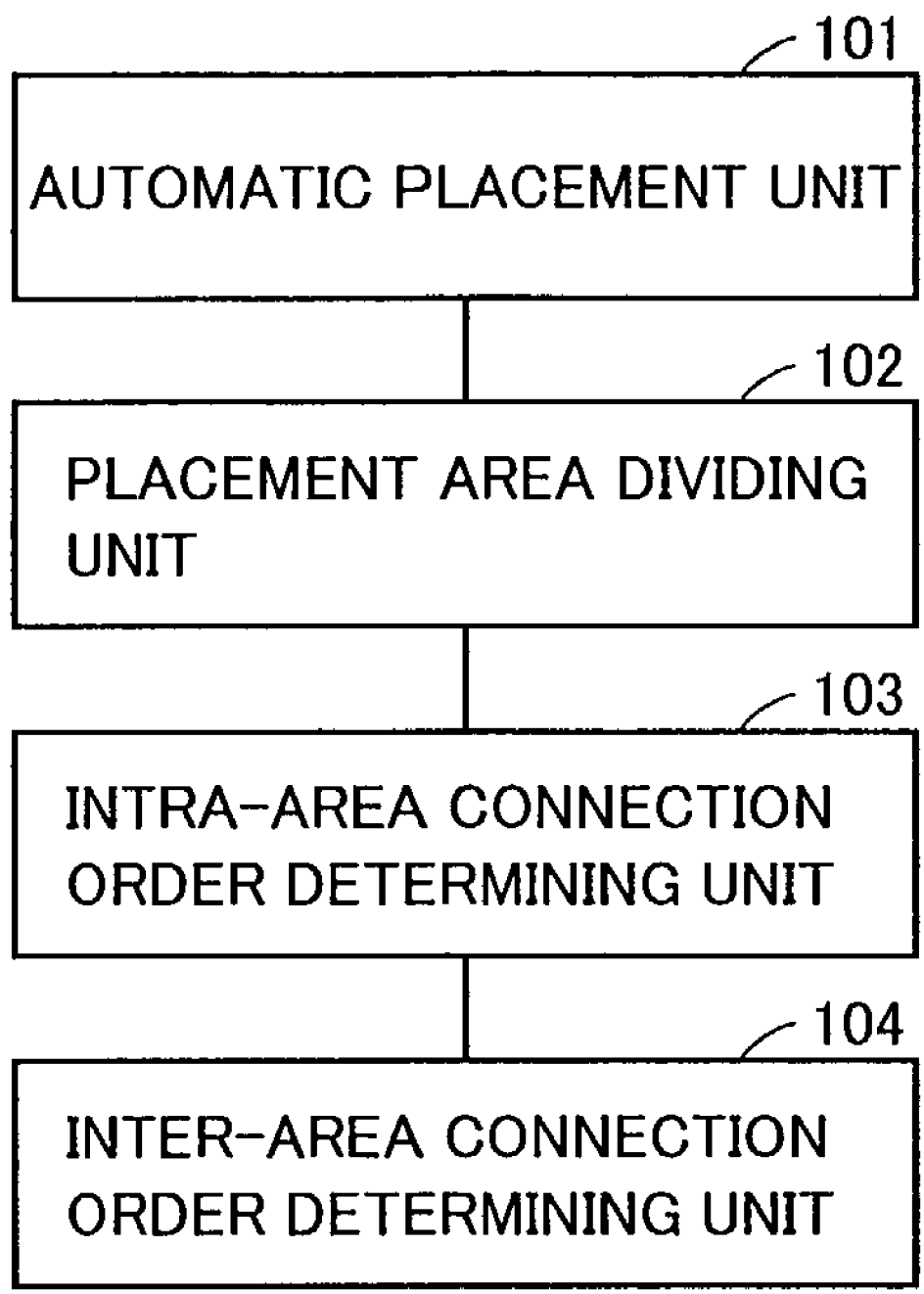
FIG. 4 is a block diagram representing a functional configuration of the scan path timing optimizing apparatus in accordance with the first embodiment of the present invention.

FIG. 4 is a block diagram representing a functional configuration of the scan path timing optimizing apparatus in accordance with the first embodiment of the present invention. The scan path timing optimizing apparatus includes an automatic placement unit 101 automatically placing cells including the scan path circuits within the semiconductor device, an placement area dividing unit 102 dividing the area of placement of the cells placed by automatic placement unit 101, an intra-area connection order determining unit 103 determining order of connection between FFs in each placement area divided by placement area dividing unit 102, and an inter-area connection order determining unit 104 determining order of connection between the placement areas divided by placement area dividing unit 102.

Figure 5:
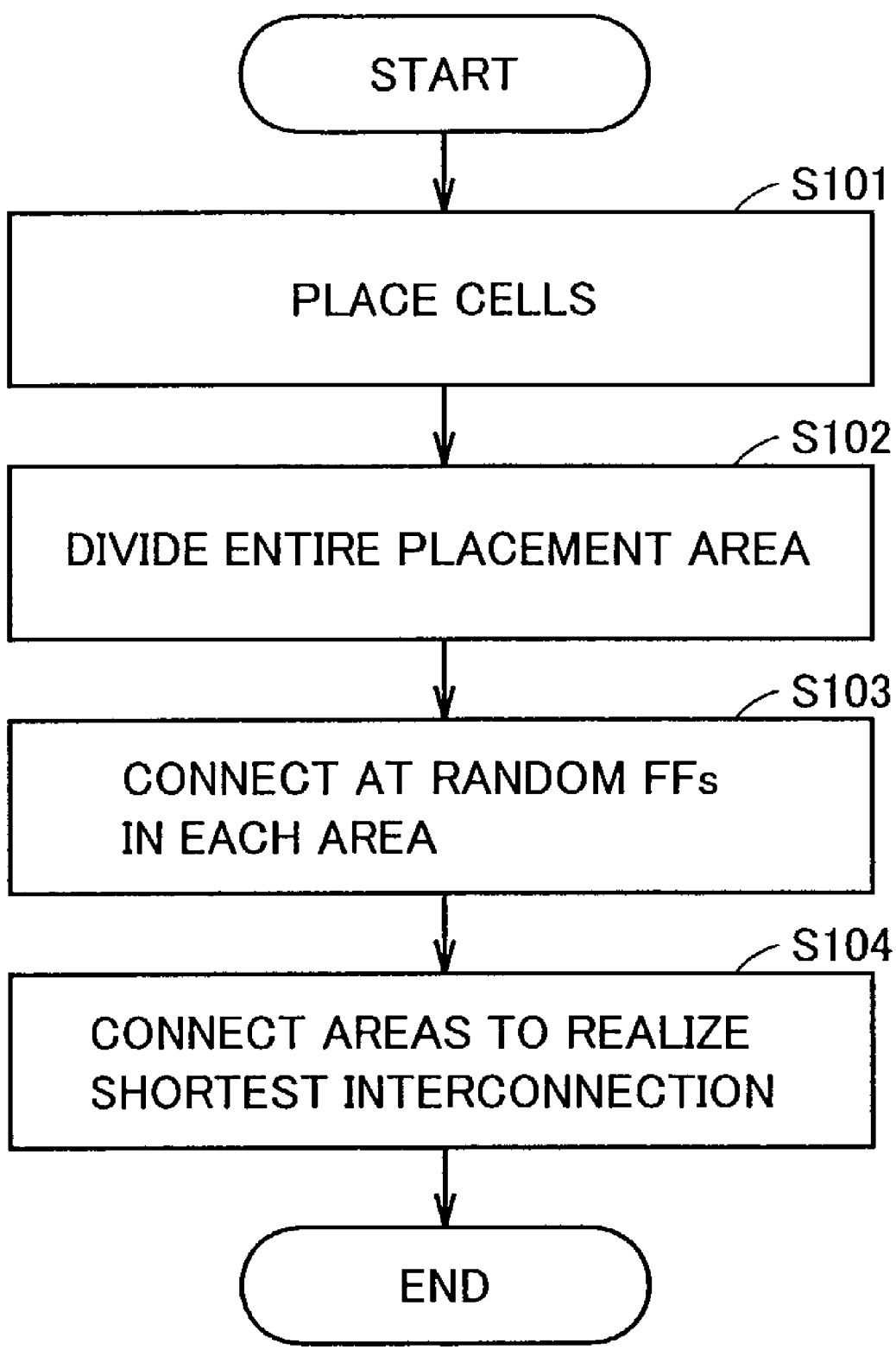
FIG. 5 is a flowchart representing a process flow of the scan path timing optimizing apparatus in accordance with the first embodiment of the present invention.

FIG. 5 is a flowchart representing a process flow of the scan path timing optimizing apparatus in accordance with the first embodiment of the present invention. First, automatic placement unit 101 automatically places cells including scan path circuits (S101). Then, placement area dividing unit 102 divides the entire placement area of the cells placed by automatic placement unit 101 into prescribed areas (S102).

Figure 6:
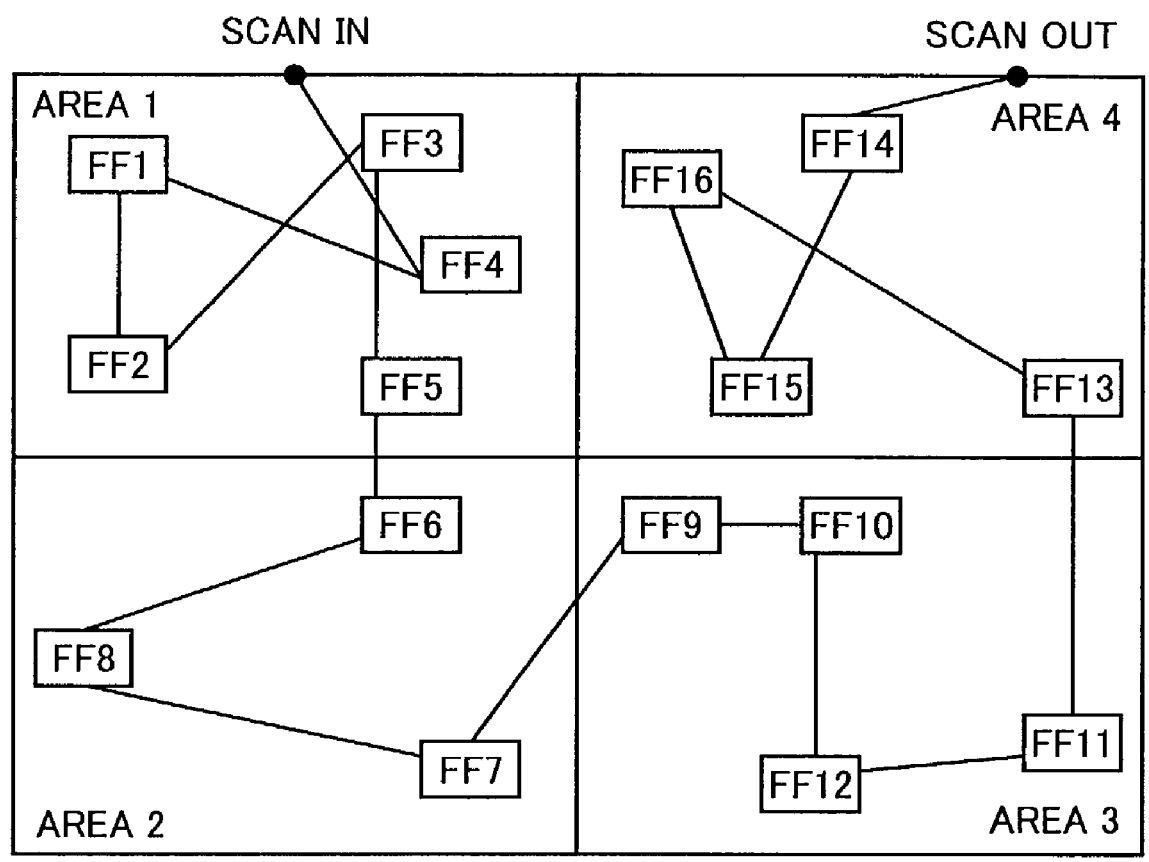
FIG. 6 illustrates the order of interconnection of FFs by the scan path timing optimizing apparatus in accordance with the first embodiment of the present invention.

FIG. 6 illustrates the order of interconnection of FFs by the scan path timing optimizing apparatus in accordance with the first embodiment of the present invention. In the example shown in FIG. 6, there are 16 scan path circuits FF1 to FF16 in the placement area. By the process of step S102, the entire area of cell placement is divided into four areas, that is, area 1 to area 4, as shown in FIG. 6. The number of division, however, is not limited thereto. For simplicity, cells other than the scan path circuits are not shown in FIG. 6.

Next, intra-area connection order determining unit 103 determines at random the order of connection of FF scan terminals, in each placement area divided by placement area dividing unit 102 (S103). By way of example, in area 1, the order of connection is determined such that "scan in terminal→FF4→FF1→FF2→FF3→FF5". As compared with area 1 shown in FIG. 2, it can be seen that the interconnection length between each FF is made longer as a whole.

Finally, inter-area connection order determining unit 104 determines the order of connection between each area such that the length of interconnection between areas divided by placement area dividing unit 102 becomes the shortest (S104). Referring to FIG. 6, FF5 of area 1 is connected to FF6 of area 2, FF7 of area 2 is connected to FF9 of area 3, and FF11 of area 3 is connected to FF13 of area 4, so that the length of interconnection between each of the areas becomes the shortest.

As described above, by the scan path timing optimizing apparatus in accordance with the first embodiment of the present invention, the cell placement area is divided into prescribed areas, the order of connection between scan terminals of FFs is determined at random in each divided area, and the order of connection of FFs in each area is determined such that the length of interconnection between divided areas becomes the shortest. Thus, it becomes possible to make longer the interconnection length between FFs locally, and hence congestion of interconnections and generation of hold time errors can be reduced.

Further, the order of connection between scan terminals of FFs in each divided area is determined at random, and thereafter the order of connection of FFs in each area is determined such that the length of interconnection between the areas is minimized. Therefore, it becomes possible to reduce the number of combinations of FFs of which length of interconnection must be calculated. Therefore, the time necessary to determine the order of connection between FFs can be made shorter.

Second Embodiment

The exemplary configuration of the scan path timing optimizing apparatus in accordance with the second embodiment of the present invention is similar to that of the scan path timing optimizing apparatus in accordance with the first embodiment of the present invention shown in FIG. 3. Therefore, detailed description will not be repeated.

Figure 7:
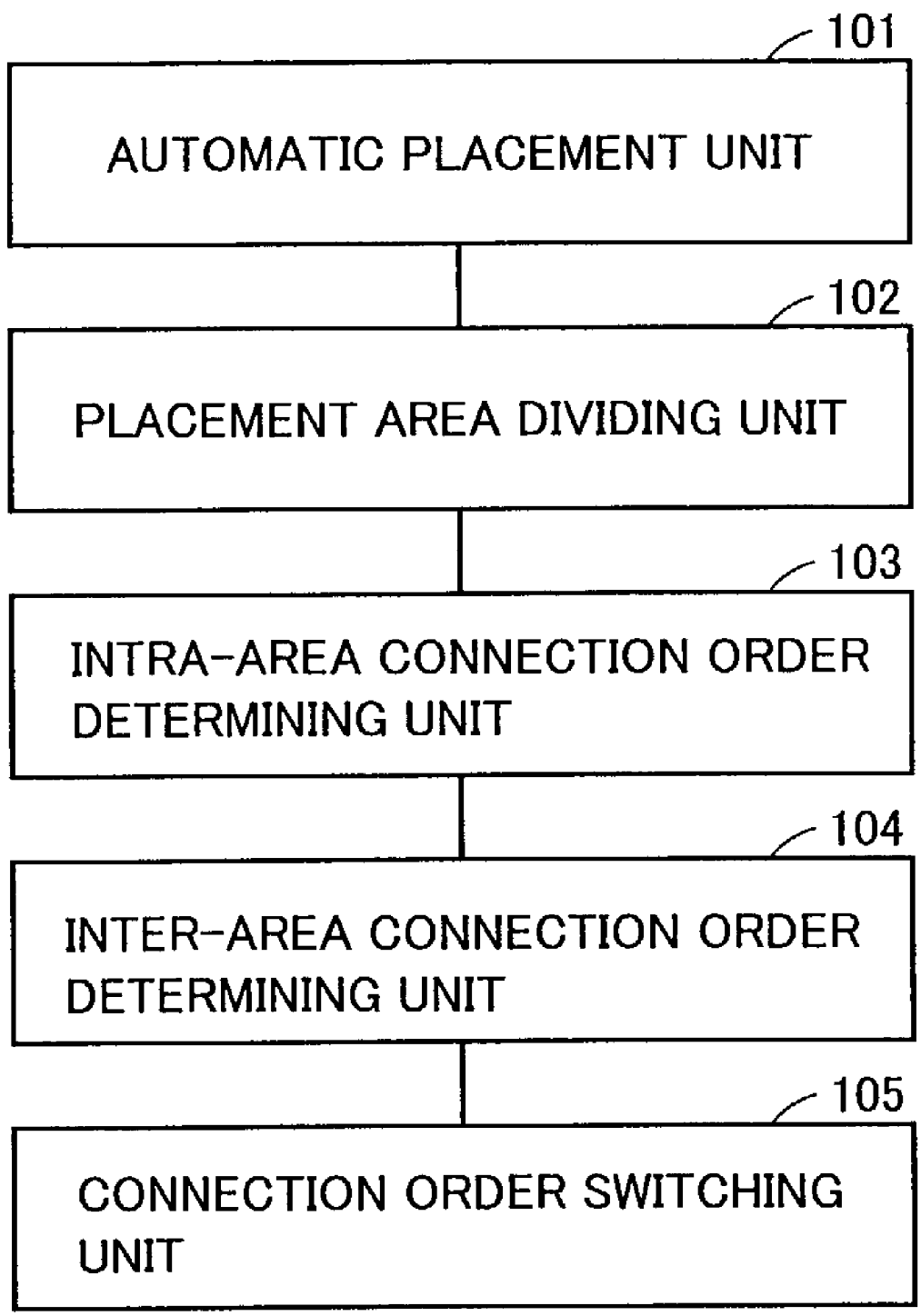
FIG. 7 is a block diagram representing a functional configuration of the scan path timing optimizing apparatus in accordance with the second embodiment of the present invention.

FIG. 7 is a block diagram representing a functional configuration of the scan path timing optimizing apparatus in accordance with the second embodiment of the present invention. As compared with the functional configuration of the scan path timing optimizing apparatus in accordance with the first embodiment shown in FIG. 4, this configuration differs only in that a connection order switching unit 105 is added, which switches the order of connection of FFs having the shortest length of interconnection among the order of connections of FFs determined by intra-area connection order determining unit 103 to another order of connection. Therefore, descriptions of overlapping configurations and functions will not be repeated.

Figure 8:
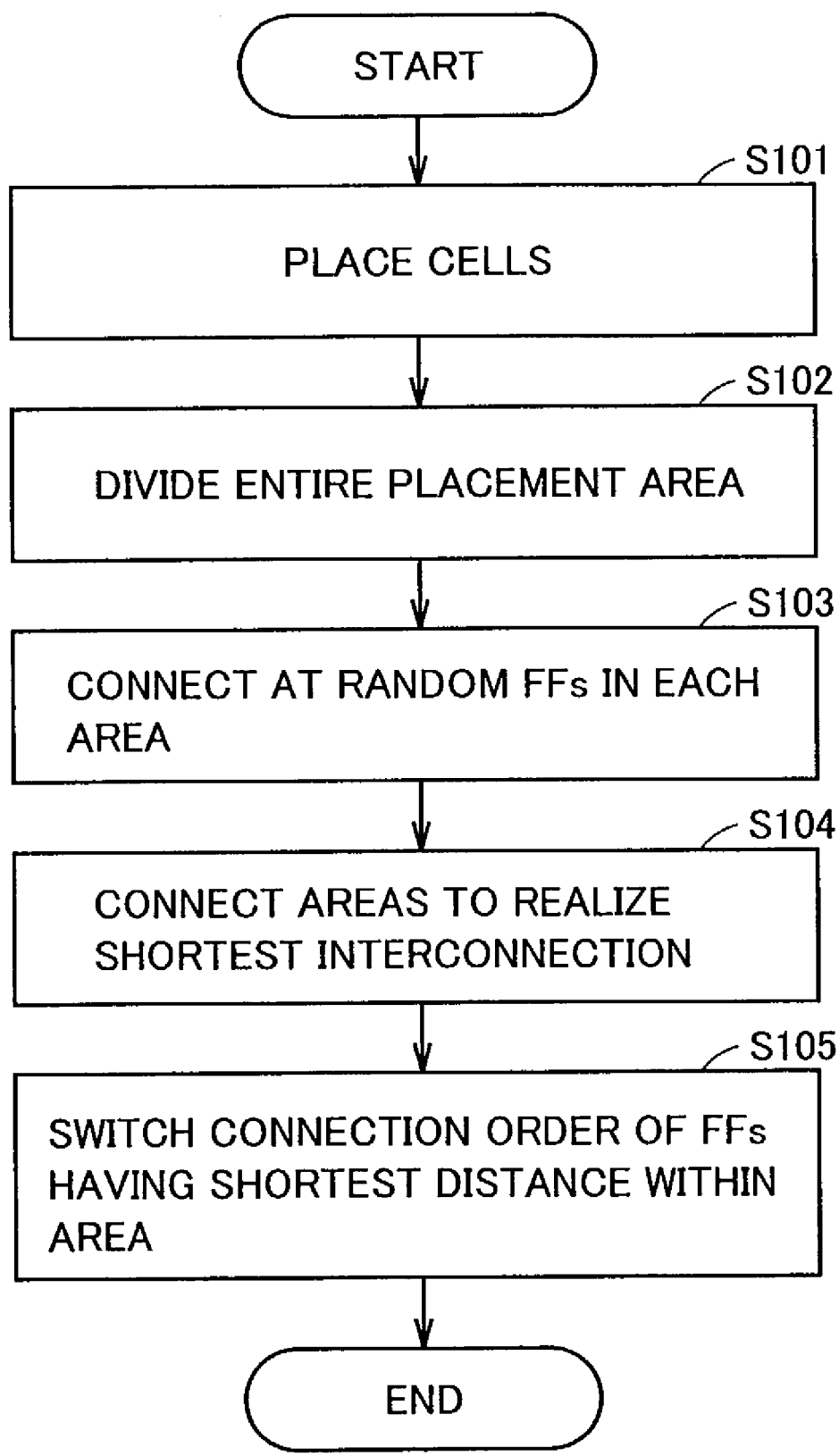
FIG. 8 is a flowchart representing a process flow of the scan path timing optimizing apparatus in accordance with the second embodiment of the present invention.

FIG. 8 is a flowchart representing a process flow of the scan path timing optimizing apparatus in accordance with the second embodiment of the present invention. As compared with the flowchart of the scan path timing optimizing apparatus in accordance with the first embodiment shown in FIG. 5, the flow differs only in that step S105 is added. Therefore, detailed description of overlapping process flow will not be repeated.

In step S105, connection order switching unit 105 switches, among the order of connections of FFs determined by intra-area connection order determining unit 103, the order of connection of FFs having the shortest length of interconnection to another order of connection.

Figure 9:
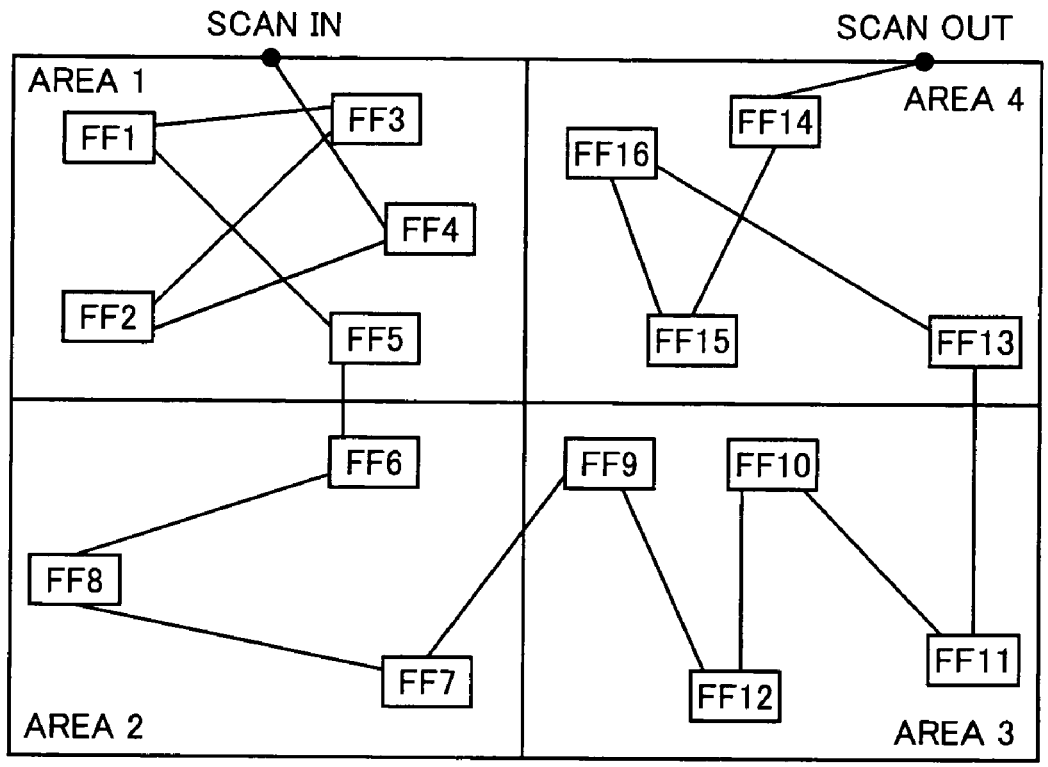
FIG. 9 illustrates the order of interconnection of FFs by the scan path timing optimizing apparatus in accordance with the second embodiment of the present invention.

FIG. 9 illustrates the order of interconnection of FFs by the scan path timing optimizing apparatus in accordance with the second embodiment of the present invention. In the order of connection determined by the scan path timing optimizing apparatus in accordance with the first embodiment shown in FIG. 6, the length of interconnection between FF1 and FF2 in area 1, and the length of interconnection between FF9 and FF10 in area 3, are the shortest.

Referring to FIG. 9, the order of connection "FF1→FF2→FF3" in area 1 is switched to "FF2→FF3→FF1", so as to eliminate the interconnection of the shortest length. Similarly, the order of connection "FF9→FF10→FF12" in area 3 is switched to "FF9→FF12→FF10", so as to eliminate the interconnection of the shortest length.

As described above, by the scan path timing optimizing apparatus in accordance with the present embodiment, among the order of connections between FFs within the divided area, the order of connection of FFs having the shortest length is switched to another order of connection between FFs, and therefore, the length of interconnection can further be made longer locally, and hence generation of hold time errors can further be reduced.

Third Embodiment

The exemplary configuration of the scan path timing optimizing apparatus in accordance with the third embodiment of the present invention is similar to that of the scan path timing optimizing apparatus in accordance with the first embodiment of the present invention shown in FIG. 3. Therefore, detailed description will not be repeated.

Figure 10:
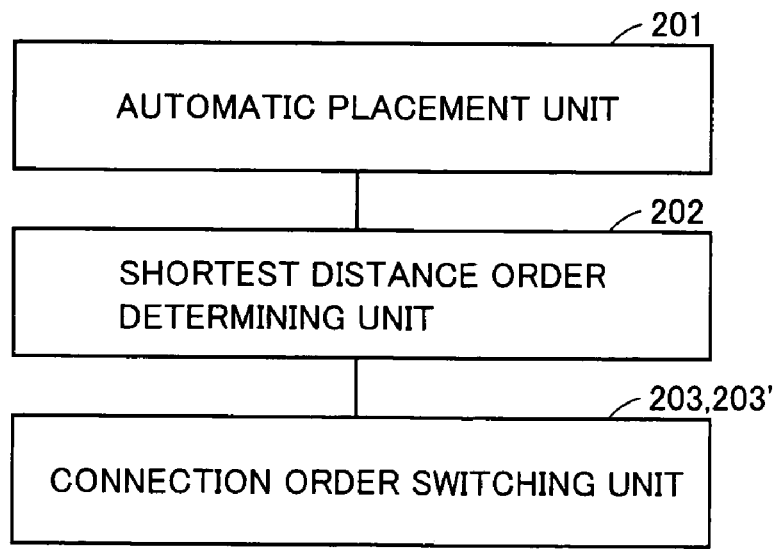
FIG. 10 is a block diagram representing a functional configuration of the scan path timing optimizing apparatus in accordance with the third embodiment of the present invention.

FIG. 10 is a block diagram representing a functional configuration of the scan path timing optimizing apparatus in accordance with the third embodiment of the present invention. The scan path timing optimizing apparatus includes an automatic placement unit 201 automatically placing cells including the scan path circuits within the semiconductor device, a shortest distance order determining unit 202 determining the order of connection of FFs such that a scan path formed by the FFs placed by automatic placement unit 201 comes to have the shortest distance, and a connection order switching unit 203 switching the order of connection of FFs determined by shortest distance order determining unit 202 to another order of connection.

Figure 11:
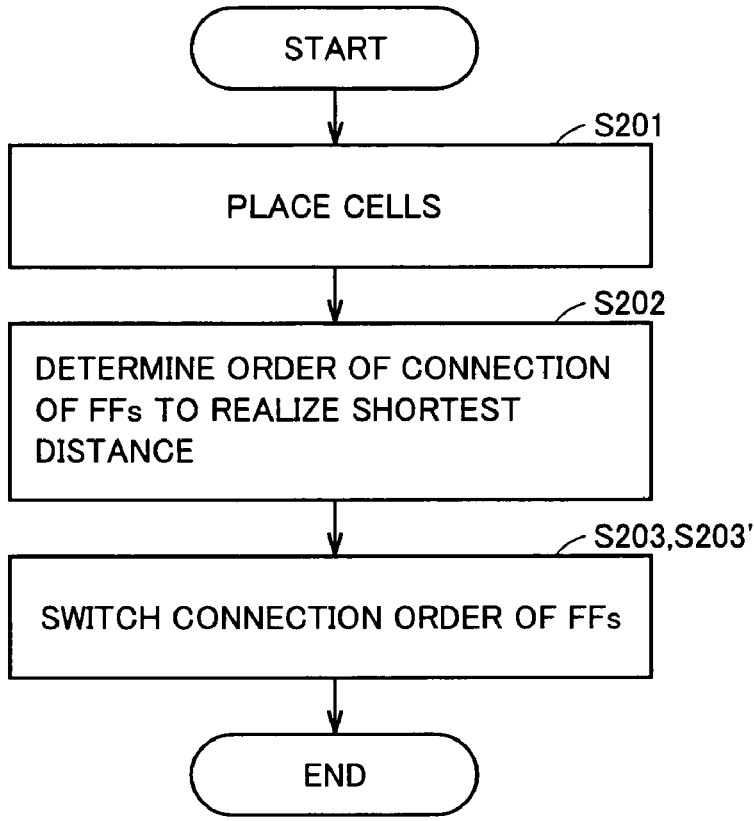
FIG. 11 is a flowchart representing a process flow of the scan path timing optimizing apparatus in accordance with the third embodiment of the present invention.

FIG. 11 is a flowchart representing a process flow of the scan path timing optimizing apparatus in accordance with the third embodiment of the present invention. First, automatic placement unit 201 automatically places cells including scan path circuits (S201). Then, shortest distance order determining unit 202 determines the order of connection between each FF so that the scan path becomes the shortest (S202).

Finally, connection order switching unit 203 switches the order of connection between each FF determined by shortest distance order determining unit 202 and determines the order of connection of the scan path (S203).

Figure 12:
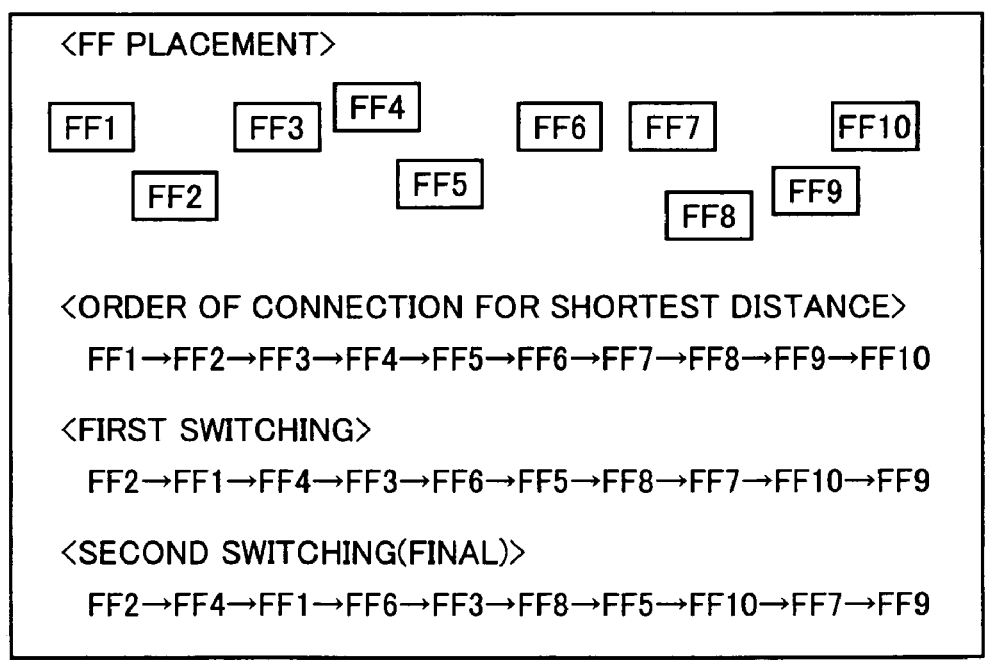
FIG. 12 illustrates the order of interconnection of FFs by the scan path timing optimizing apparatus in accordance with the third embodiment of the present invention.

FIG. 12 illustrates the order of interconnection of FFs by the scan path timing optimizing apparatus in accordance with the third embodiment of the present invention. In the example shown in FIG. 12, there are 10 FFs, and the order of connection that realizes the shortest scan path determined by shortest distance order determining unit 202 is "FF1→FF2→FF3→FF4→FF5→FF6→FF7→FF8→FF9→FF10."

As the first switching process, connection order switching unit 203 switches the orders two by two starting from the first FF. By this switching process, connection order of FFs will be "FF2→FF1→FF4→FF3→FF6→FF5→FF8→FF7→FF10→FF9."

Next, as the second switching process, connection order switching unit 203 switches the orders two by two starting from the second FF. By this switching process, connection order of FFs will be "FF2→FF4→FF1→FF6→FF3→FF8→FF5→FF10→FF7→FF9."

As described above, by the scan path timing optimizing apparatus in accordance with the present embodiment, the order of connection of FFs is determined so that the scan path has the shortest distance, the order is switched two by two starting form the first FF, and then the order is again switched two by two starting from the second FF. Therefore, interconnection length between FFs can be locally made longer, and congestion of interconnections and hold time errors can be reduced.

Further, after the order of connection of FFs is determined such that the scan path has the shortest distance, interconnection between each FF can be established simply by switching the order of connection of FFs. Therefore, it becomes possible to obtain, in a short period of time, a resulting layout that has high degree of integration.

Fourth Embodiment

The exemplary configuration of the scan path timing optimizing apparatus in accordance with the fourth embodiment of the present invention is similar to that of the scan path timing optimizing apparatus in accordance with the first embodiment of the present invention shown in FIG. 3. Therefore, detailed description will not be repeated.

As compared with the functional configuration of the scan path timing optimizing apparatus in accordance with the third embodiment shown in FIG. 10, the configuration in accordance with the fourth embodiment differs only in that a connection order switching unit 203 has a different function. Therefore, descriptions of overlapping configurations and functions will not be repeated. In the present embodiment, the connection order switching unit will be designated by the reference character 203'.

As compared with the flowchart of the scan path timing optimizing apparatus in accordance with the third embodiment shown in FIG. 11, the flow of the fourth embodiment differs only in the process of step S203. Therefore, detailed description of overlapping process flow will not be repeated. In the present embodiment, step S203 will be denoted by the reference character S203'.

In step S203', connection order switching unit 203' switches the order of connections between FFs determined by shortest distance order determining unit 202, and determines the order of connection of the scan path.

Figure 13:
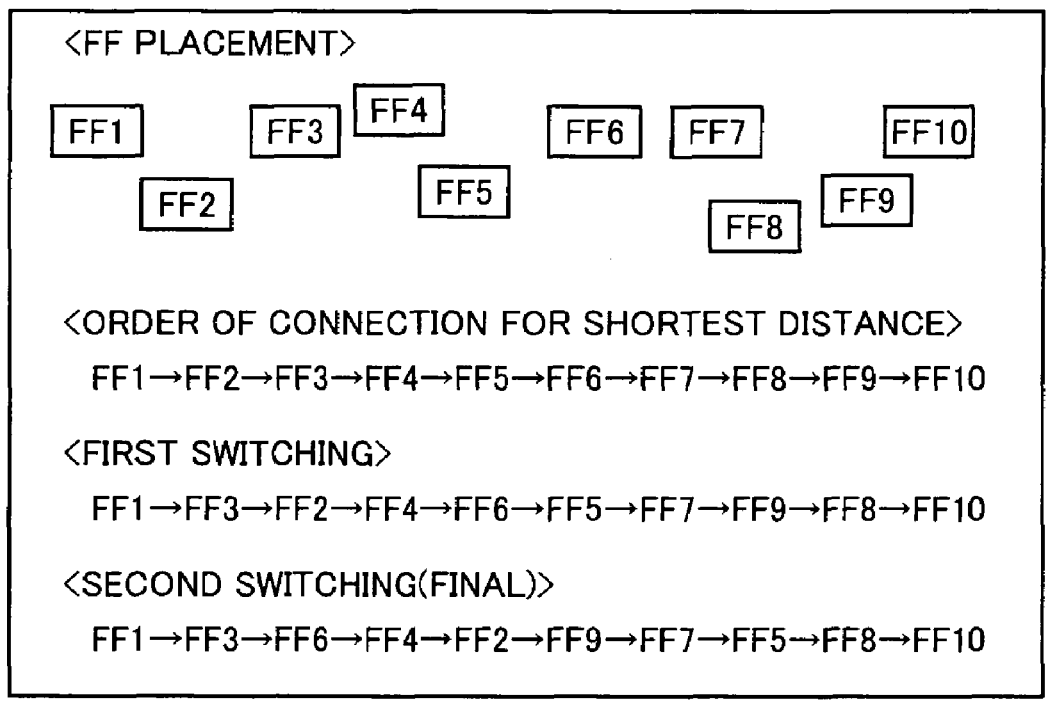
FIG. 13 illustrates the order of interconnection of FFs by the scan path timing optimizing apparatus in accordance with the fourth embodiment of the present invention.

FIG. 13 illustrates the order of interconnection of FFs by the scan path timing optimizing apparatus in accordance with the fourth embodiment of the present invention. In the example shown in FIG. 13, there are 10 FFs, and the order of connection that realizes the shortest scan path determined by shortest distance order determining unit 202 is "FF1→FF2→FF3→FF4→FF5→FF6→FF7→FF8→FF9→FF10."

Connection order switching unit 203' forms three by three sets of FFs starting from the first FF and switches the order of FFs within each set, as the first switching process. In the example shown in FIG. 13, the order in the set consisting of FF1, FF2 and FF3 is switched to "FF1, FF3, FF2", the order in the set consisting of FF4, FF5 and FF6 is switched to "FF4, FF6, FF5", and the order in the set consisting of FF7, FF8 and FF9 is switched to "FF7, FF9, FF8". By this switching process, the order of connection between FFs will be ""FF1→FF3→FF2→FF4→FF6→FF5→FF7→FF9→FF8→FF10."

Thereafter, connection order switching unit 203' forms three by three sets of FFs except for the first two FFs, and switches the order of FFs within each set, as the second switching process. In the example shown in FIG. 13, the order in the set consisting of FF2, FF4 and FF6 is reversed to FF6, FF4 and FF2, and, the order in the set consisting of FF5, FF7 and FF9 is reversed to FF9, FF7 and FF5. By this switching process, the order of connection between FFs will be ""FF1→FF3→FF6→FF4→F2→FF9→FF7→FF5→FF8→FF10."

It is noted that the order of FFs may be switched by forming sets of four or more FFs, and order of FFs may be switched in any manner within each set. For example, order of two FFs may be switched in one set, and order of three FFs may be switched in another set. Alternatively, order of two FFs may be switched in a first process and order of three FFs may be switched in a second process, within a set.

As described above, by the scan path timing optimizing apparatus in accordance with the present embodiment, the order of connection of FFs is determined so that the scan path has the shortest distance, FFs are grouped into a plurality sets of connected FFs, the order of FFs is switched in each set, FFs are grouped into a plurality sets of connected FFs by a different method, and the order of FFs is switched in each set. Therefore, interconnection length between FFs can be locally made longer, and congestion of interconnections and hold time errors can be reduced.

Further, after the order of connection of FFs is determined such that the scan path has the shortest distance, interconnection between each FF can be established simply by switching the order of connection of FFs. Therefore, it becomes possible to obtain, in a short period of time, a resulting layout that has high degree of integration.

Fifth Embodiment

The exemplary configuration of the scan path timing optimizing apparatus in accordance with the fifth embodiment of the present invention is similar to that of the scan path timing optimizing apparatus in accordance with the first embodiment of the present invention shown in FIG. 3. Therefore, detailed description will not be repeated.

Figure 14:
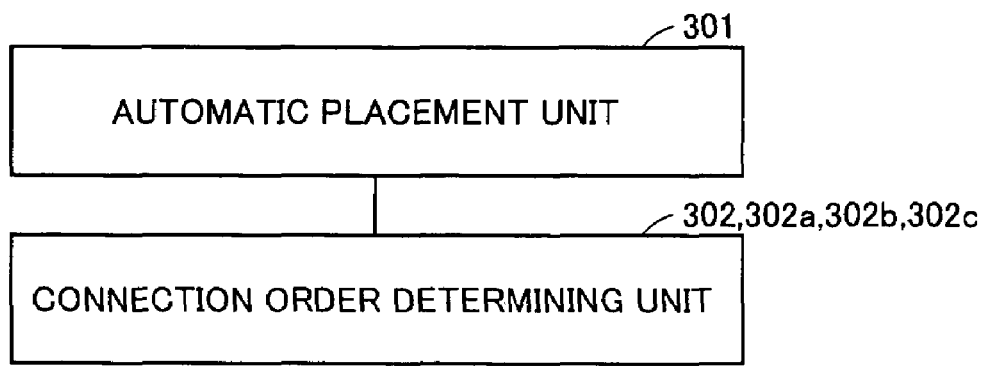
FIG. 14 is a block diagram representing a functional configuration of the scan path timing optimizing apparatus in accordance with the fifth embodiment of the present invention.

FIG. 14 is a block diagram representing a functional configuration of the scan path timing optimizing apparatus in accordance with the fifth embodiment of the present invention. The scan path timing optimizing apparatus includes an automatic placement unit 301 automatically placing cells including the scan path circuits within the semiconductor device, and a connection order determining unit 302 determining the order of connection of FFs placed by automatic placement unit 301.

Figure 15:
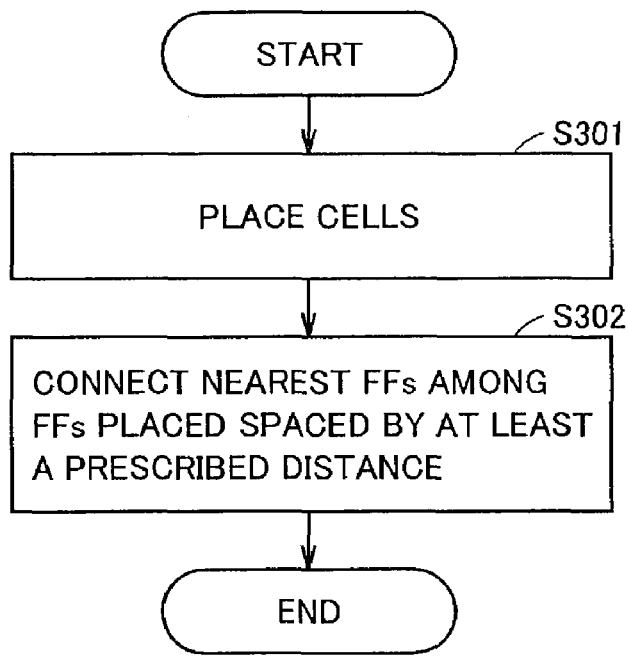
FIG. 15 is a flowchart representing a process flow of the scan path timing optimizing apparatus in accordance with the fifth embodiment of the present invention.

FIG. 15 is a flowchart representing a process flow of the scan path timing optimizing apparatus in accordance with the fifth embodiment of the present invention. First, automatic placement unit 301 automatically places cells including scan path circuits (S301). Then, connection order determining unit 302 connects FFs at the shortest distance, among FFs placed spaced at least by a prescribed distance from each other (S302).

Figure 16:
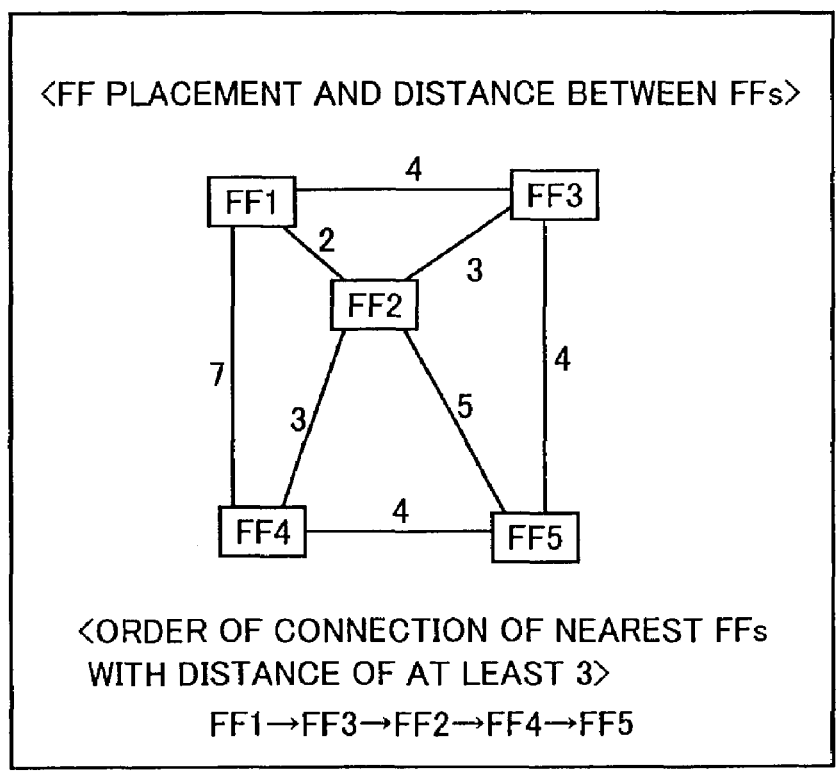
FIG. 16 illustrates determination of the order of connection of FFs by the scan path timing optimizing apparatus in accordance with the fifth embodiment of the present invention.

FIG. 16 illustrates determination of the order of connection of FFs by the scan path timing optimizing apparatus in accordance with the fifth embodiment of the present invention. In FIG. 16, numerals between FFs represent connection distance between the FFs. When FF1 to FF5 are placed as shown in FIG. 16, the order of connection of nearest FFs with the distance of at least 3 will be "FF1→FF3→FF2→FF4→FF5", with FF1 being the start point.

As described above, by the scan path timing optimizing apparatus in accordance with the present embodiment, nearest FFs are connected among FFs placed at a prescribed distance or longer. Therefore, while avoiding long interconnections, interconnection length between FFs can be locally made longer, and congestion of interconnections and hold time errors can be reduced.

Further, order of connection of the scan path circuits can be determined simply by connecting nearest FFs among FFs placed at a prescribed distance or longer. Therefore, it becomes possible to obtain, in a short period of time, a resulting layout that has high degree of integration.

Sixth Embodiment

The exemplary configuration of the scan path timing optimizing apparatus in accordance with the sixth embodiment of the present invention is similar to that of the scan path timing optimizing apparatus in accordance with the first embodiment of the present invention shown in FIG. 3. Therefore, detailed description will not be repeated.

As compared with the functional configuration of the scan path timing optimizing apparatus in accordance with the fifth embodiment shown in FIG. 14, the configuration in accordance with the sixth embodiment differs only in that a connection order determining unit 302 has a different function. Therefore, descriptions of overlapping configurations and functions will not be repeated. In the present embodiment, the connection order determining unit will be designated by the reference character 302a.

Figure 17:
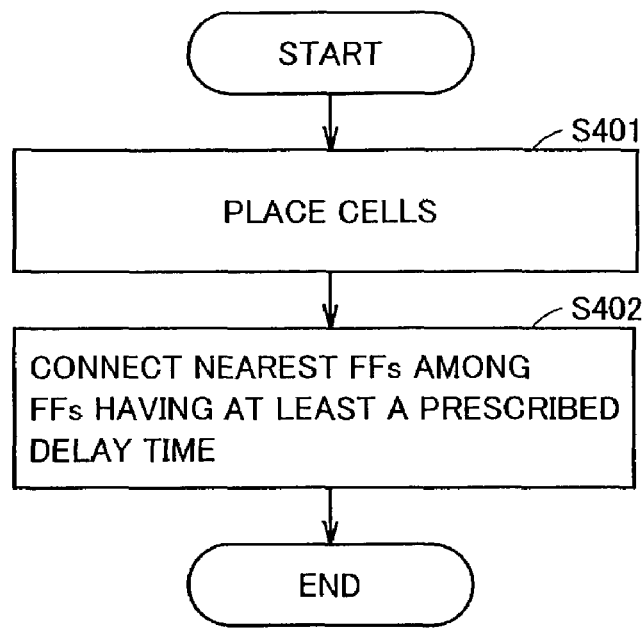
FIG. 17 is a flowchart representing a process flow of the scan path timing optimizing apparatus in accordance with the sixth embodiment of the present invention.

FIG. 17 is a flowchart representing a process flow of the scan path timing optimizing apparatus in accordance with the sixth embodiment of the present invention. First, automatic placement unit 301 automatically places cells including scan path circuits (S401). Then, connection order determining unit 302a connects nearest FFs among combinations of FFs that are estimated to have at least a prescribed delay time, considering drivability of cells driving the scan terminals of FFs (S402).

Figure 18:
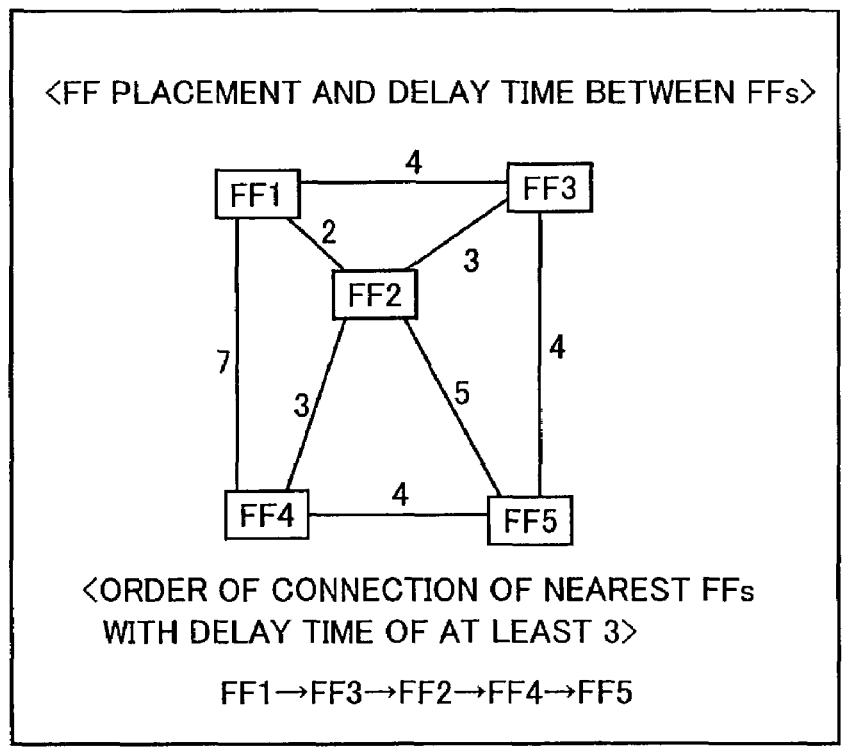
FIG. 18 illustrates determination of the order of connection of FFs by the scan path timing optimizing apparatus in accordance with the sixth embodiment of the present invention.

FIG. 18 illustrates determination of the order of connection of FFs by the scan path timing optimizing apparatus in accordance with the sixth embodiment of the present invention. In FIG. 18, numerals between FFs represent estimated delay time of scan terminals between the FFs. When FF1 to FF5 are placed as shown in FIG. 18, the order of connection of nearest FFs among combinations of FFs with estimated delay time of at least 3 will be "FF1→FF3→FF2→FF4→FF5", with FF1 being the start point.

As described above, by the scan path timing optimizing apparatus in accordance with the present invention, nearest FFs are connected among combinations of FFs that are estimated to have at least a prescribed delay time. Therefore, while avoiding long interconnections, interconnection length between FFs can be locally made longer, and congestion of interconnections and hold time errors can be reduced.

Further, it is possible to determine order of connection of the scan path circuits simply by connecting nearest FFs among the combinations of FFs that are estimated to have at least a prescribed delay time. Therefore it becomes possible to obtain, in a short period of time, a resulting layout that has high degree of integration.

Seventh Embodiment

The exemplary configuration of the scan path timing optimizing apparatus in accordance with the seventh embodiment of the present invention is similar to that of the scan path timing optimizing apparatus in accordance with the first embodiment of the present invention shown in FIG. 3. Therefore, detailed description will not be repeated.

As compared with the functional configuration of the scan path timing optimizing apparatus in accordance with the fifth embodiment shown in FIG. 14, the configuration in accordance with the seventh embodiment differs only in that a connection order determining unit 302 has a different function. Therefore, descriptions of overlapping configurations and functions will not be repeated. In the present embodiment, the connection order determining unit will be designated by the reference character 302b.

Figure 19:
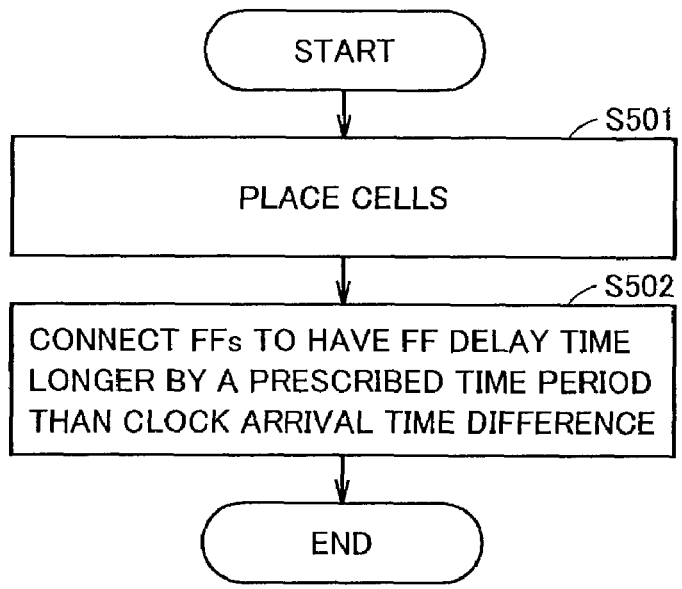
FIG. 19 is a flowchart representing a process flow of the scan path timing optimizing apparatus in accordance with the seventh embodiment of the present invention.

FIG. 19 is a flowchart representing a process flow of the scan path timing optimizing apparatus in accordance with the seventh embodiment of the present invention. First, automatic placement unit 301 automatically places cells including scan path circuits (S501). Then, connection order determining unit 302b connects FFs such that scan path delay time becomes at least a prescribed time period longer than clock arrival time difference, considering time of arrival of clocks to the FFs (S502). Here, the clock arrival time difference refers to (clock arrival time of an input side FF−clock arrival time of an output side FF), in the scan path circuits to be connected.

Figure 20:
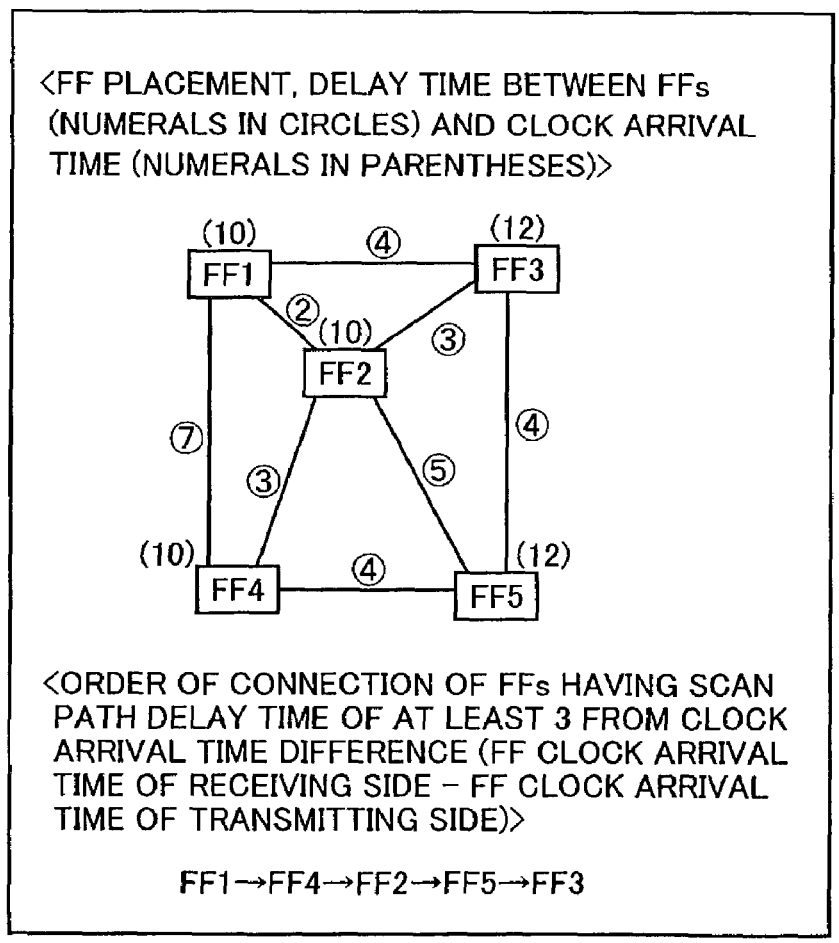
FIG. 20 illustrates determination of the order of connection of FFs by the scan path timing optimizing apparatus in accordance with the seventh embodiment of the present invention.

FIG. 20 illustrates determination of the order of connection of FFs by the scan path timing optimizing apparatus in accordance with the seventh embodiment of the present invention. In FIG. 20, numerals in circles between FFs represent estimated delay time of scan terminals between the FFs, and numerals in parentheses appended to FFs represent clock arrival time to the corresponding FFs. When FF1 to FF5 are placed as shown in FIG. 20, the order of connection of FFs that realizes delay time of scan terminals between FFs longer than the clock arrival time difference by at least 3 will be "FF1→FF4→FF2→FF5→FF3", with FF1 being the start point.

As described above, by the scan path timing optimizing apparatus in accordance with the present invention, FFs are connected such that the delay time at the scan terminals between the FFs is made longer by at least a prescribed time period than the clock arrival time difference. Therefore, as compared with the scan path timing optimizing apparatus in accordance with the sixth embodiment, generation of hold time errors can further be reduced.

Eighth Embodiment

The exemplary configuration of the scan path timing optimizing apparatus in accordance with the eighth embodiment of the present invention is similar to that of the scan path timing optimizing apparatus in accordance with the first embodiment of the present invention shown in FIG. 3. Therefore, detailed description will not be repeated.

As compared with the functional configuration of the scan path timing optimizing apparatus in accordance with the fifth embodiment shown in FIG. 14, the configuration in accordance with the eighth embodiment differs only in that a connection order determining unit 302 has a different function. Therefore, descriptions of overlapping configurations and functions will not be repeated. In the present embodiment, the connection order determining unit will be designated by the reference character 302c.

Figure 21:
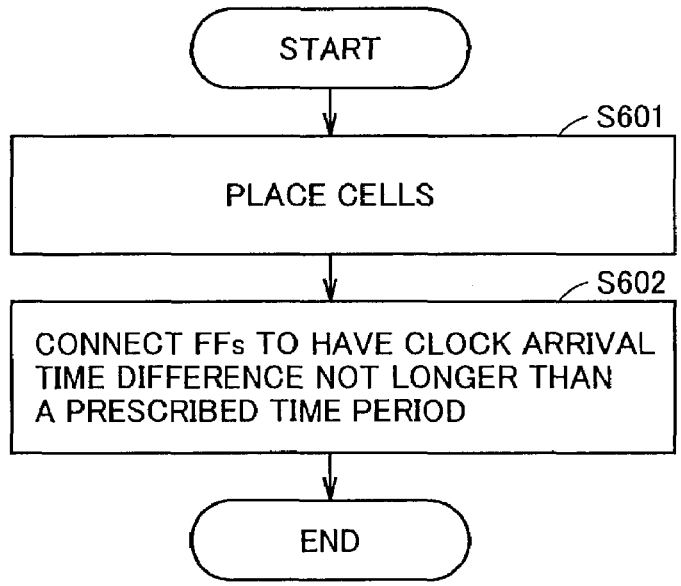
FIG. 21 is a flowchart representing a process flow of the scan path timing optimizing apparatus in accordance with the eighth embodiment of the present invention.

FIG. 21 is a flowchart representing a process flow of the scan path timing optimizing apparatus in accordance with the eighth embodiment of the present invention. First, automatic placement unit 301 automatically places cells including scan path circuits (S601). Then, connection order determining unit 302c connects FFs such that clock arrival time at an input side FF is not later by more than a prescribed time period than clock arrival time at an output side FF, considering time of arrival of clocks to the FFs (S602).

Figure 22:
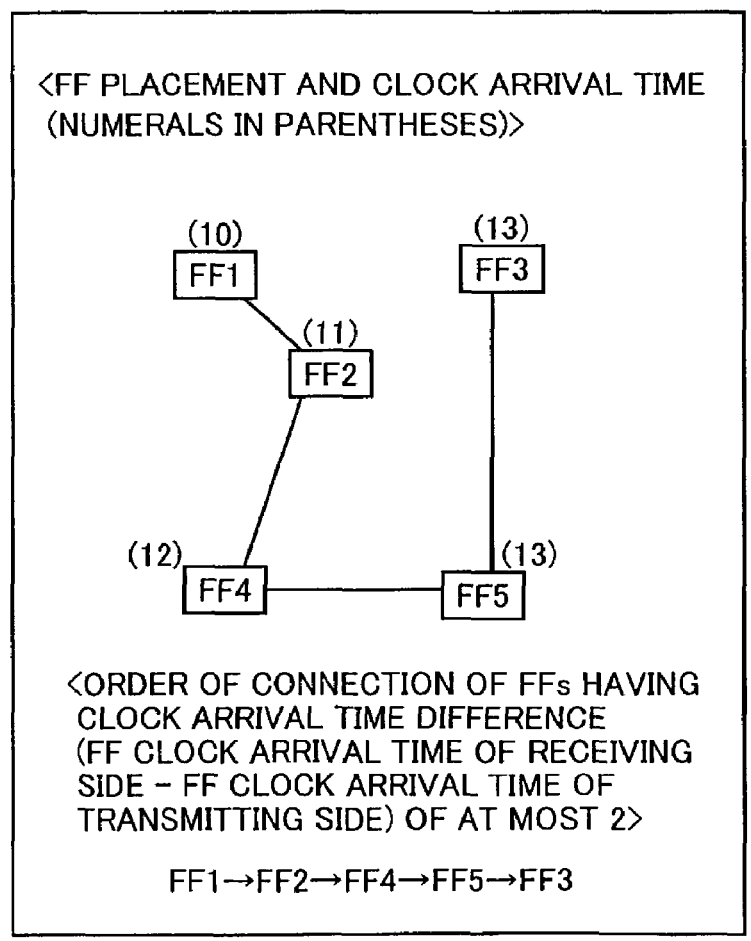
FIG. 22 illustrates determination of the order of connection of FFs by the scan path timing optimizing apparatus in accordance with the eighth embodiment of the present invention.

FIG. 22 illustrates determination of the order of connection of FFs by the scan path timing optimizing apparatus in accordance with the eighth embodiment of the present invention. In FIG. 22, numerals in parentheses appended to FFs represent clock arrival time to the corresponding FFs. When FF1 to FF5 are placed as shown in FIG. 22, the order of connection of FFs that realizes clock arrival time difference (clock arrival time of an input side FF−clock arrival time of an output side FF) of at most 2 will be "FF1→FF2→FF4→FF5→FF3", with FF1 being the start point.

As described above, by the scan path timing optimizing apparatus in accordance with the present invention, FFs are connected such that clock arrival time at an input side FF is not later by more than a prescribed time period than clock arrival time at an output side FF. Therefore, while avoiding long interconnections, interconnection length between FFs can be locally made longer, and congestion of interconnections and hold time errors can be reduced.

Further, it is possible to determine order of connection of the scan path circuits simply by connecting FFs such that the clock arrival time difference becomes no longer than a prescribed time period. Therefore it becomes possible to obtain, in a short period of time, a resulting layout that has high degree of integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A scan path timing optimizing apparatus, comprising:
a placement area dividing unit dividing a cell placement area into a plurality of areas;
an intra-area connection order determining unit determining a random order of interconnections between scan path circuits in each of the plurality of areas; and
an inter-area connection order determining unit for determining an order of interconnection of the scan path circuits between each of the plurality of areas such that a length of interconnection between the plurality of areas becomes a shortest interconnection, wherein a length of an interconnection between scan path circuits is greater than the shortest interconnection between the plurality of areas.

2. The scan path timing optimizing apparatus according to claim 1, further comprising:
a connection order switching unit switching, among orders of connection of the scan path circuits determined by said intra-area connection order determining unit, a connection order of the scan path circuits that has a short length of interconnection.

3. A scan path timing optimizing apparatus, comprising:
a shortest distance order determining unit for determining an order of interconnections between scan path circuits such that the scan path becomes a shortest interconnection; and
a connection order switching unit for switching the order of interconnections between the scan path circuits determined by said shortest distance order determining unit, in accordance with a prescribed rule, wherein a length of an interconnection between scan path circuits is greater than the shortest interconnection between the plurality of areas.

4. The scan path timing optimizing apparatus according to claim 3, wherein
said connection order switching unit first switches, among the orders of connection determined by said shortest distance order determining unit, orders of connection of the scan path circuits of two adjacent scan path circuits starting from a first scan path circuit, and thereafter, switches orders of connection of the scan path circuits of two adjacent scan path circuits starting from a second scan path circuit.

5. The scan path timing optimizing apparatus according to claim 3, wherein
said connection order switching unit divides the scan path circuits having the orders of connection determined by said shortest distance order determining unit into a plurality of sets, switches orders of connection of the scan path circuits in each set, thereafter divides the scan path circuits into a plurality of sets by a different method, and switches orders of connection of the scan path circuits in each set.

6. A scan path timing optimizing apparatus, comprising:
an automatic placement unit for automatically placing cells in a semiconductor device; and
a connection order determining unit for determining an order of interconnections between scan path circuits in accordance with a prescribed rule such that a delay time between the scan path circuits placed by said automatic placement unit, wherein said delay time becomes at least a prescribed time period, and a length of an interconnection between scan path circuits is greater than a shortest interconnection between the plurality of areas.

7. The scan path timing optimizing apparatus according to claim 6, wherein
said connection order determining unit connects nearest scan path circuits among scan path circuits placed with at least a prescribed distance from each other.

8. The scan path timing optimizing apparatus according to claim 6, wherein
said connection order determining unit connects nearest scan path circuits among combinations of scan path circuits of which delay time between scan terminals is estimated to be at least a prescribed time period.

9. The scan path timing optimizing apparatus according to claim 6, wherein
said connection order determining unit connects the scan path circuits such that delay time between scan terminals becomes at least a prescribed time period longer than a clock arrival time difference.

10. The scan path timing optimizing apparatus according to claim 6, wherein
said connection order determining unit connects the scan path circuits such that clock arrival time difference between the scan path circuits is not longer than a prescribed time period.

* * * * *